(12) United States Patent
Jang et al.

(10) Patent No.: US 10,700,667 B2
(45) Date of Patent: Jun. 30, 2020

(54) METAL-SEMICONDUCTOR-METAL TWO-DIMENSIONAL ELECTRON GAS VARACTOR AND METHOD OF MANUFACTURING THE SAME

(71) Applicant: GWANGJU INSTITUTE OF SCIENCE AND TECHNOLOGY, Gwangju (KR)

(72) Inventors: Jae Hyung Jang, Gwangju (KR); Ji Hyun Hwang, Gwangju (KR)

(73) Assignee: GWANGJU INSTITUTE OF SCIENCE AND TECHNOLOGY, Gwangju (KR)

(*) Notice: Subject to any disclaimer, the term of this patent is extended or adjusted under 35 U.S.C. 154(b) by 209 days.

(21) Appl. No.: 15/827,290

(22) Filed: Nov. 30, 2017

(65) Prior Publication Data

US 2018/0241377 A1    Aug. 23, 2018

(30) Foreign Application Priority Data

Feb. 20, 2017   (KR) .................. 10-2017-0022568

(51) Int. Cl.
```
H03J 3/18      (2006.01)
H03B 5/12      (2006.01)
H01L 29/66     (2006.01)
H01L 29/93     (2006.01)
H01L 29/20     (2006.01)
H01L 29/205    (2006.01)
```
(52) U.S. Cl.
CPC ........ *H03J 3/185* (2013.01); *H01L 29/66174* (2013.01); *H01L 29/93* (2013.01); *H03B 5/1243* (2013.01); *H01L 29/2003* (2013.01); *H01L 29/205* (2013.01); *H03B 2201/0208* (2013.01)

(58) Field of Classification Search
None
See application file for complete search history.

(56) References Cited

FOREIGN PATENT DOCUMENTS

KR    10-2006-0126712 A    12/2006

OTHER PUBLICATIONS

Nouman et al., "Terahertz Modulator based on Metamaterials integrated with Metal-Semiconductor-Metal Varactors," Scientific Reports, May 19, 2016, pp. 1-7, vol. 6:26452.
Dianat et al., "A Light-activated Quantum Capacitance Device as a Highly Tunable Variable Capacitor," Frontiers in Optics 2013/Laser Science XXIX, 2012, 2 pages.
Korean Office Action dated Apr. 13, 2018, issued in corresponding Korean Patent Application No. 10-2017-0022568.
M. Marso et al., "Comparison of AlGaN/GaN MSM Varactor Diodes Based on HFET and MOSHFET Layer Structures", IEEE Electron Device Letters, Dec. 2006, pp. 945-947, vol. 27, No. 12, IEEE.

(Continued)

*Primary Examiner* — Alexander G Ghyka
(74) *Attorney, Agent, or Firm* — Hauptman Ham, LLP (57) ABSTRACT

Disclosed are a metal-semiconductor-metal two-dimensional electron gas varactor (MSM-2DEG) and a method of manufacturing the same. There is provided an MSM-2DEG varactor having an asymmetric structure, which includes a first gate formed on a semiconductor layer, and a second gate spaced apart at a predetermined distance from the first gate and formed on the semiconductor layer, wherein the first gate and the second gate are different in shape and gate length.

8 Claims, 10 Drawing Sheets

(56) References Cited

OTHER PUBLICATIONS

Dae-Myeong Geum et al., "Metal—Semiconductor—Metal Varactors Based on InAlN/GaN Heterostructure With Cutoff Frequency of 308 GHz", IEEE Electron Device Letters, Apr. 2015, pp. 306-308, vol. 36, No. 4, IEEE.

Ji Hyun Hwang et al., "Balanced MSM-2DEG Varactors Based on AlGaN/GaN Heterostructure With Cutoff Frequency of 1.54 THz", IEEE Electron Device Letters, Nov. 16, 2016, pp. 107-110, vol. 38, No. 1, IEEE.

| | $C_{max}$ (fF) | $C_{min}$ (fF) | $R_0$ (Ω) | C-ratio ($C_{max}/C_{min}$) | $f_0$ [THz] | FOM [THz] | $C_{max}/W$ [fF/μm] |
|---|---|---|---|---|---|---|---|
| SS | 5.03 (±0.20) | 3.07 (±0.12) | 27.3 (±0.37) | 1.64 (±0.05) | 1.16 (±0.05) | 1.90 (±0.07) | 0.25 (±0.01) |
| AS | 9.04 (±0.13) | 3.28 (±0.11) | 16.7 (±0.34) | 2.75 (±0.12) | 1.05 (±0.03) | 2.90 (±0.13) | 0.45 (±0.01) |
| BS | 9.08 (±0.12) | 3.44 (±0.10) | 11.4 (±0.52) | 2.64 (±0.09) | 1.54 (±0.08) | 4.06 (±0.20) | 0.45 (±0.01) |

METAL-SEMICONDUCTOR-METAL TWO-DIMENSIONAL ELECTRON GAS VARACTOR AND METHOD OF MANUFACTURING THE SAME

CROSS-REFERENCE TO RELATED APPLICATION

This application claims priority to and the benefit of Korean Patent Application No. 10-2017-0022568, filed on Feb. 20, 2017, the disclosure of which is incorporated herein by reference in its entirety.

BACKGROUND

1. Field of the Invention

The present disclosure relates to a metal-semiconductor-metal two-dimensional electron gas (MSM-2DEG) varactor and a method of manufacturing the same, and more particularly to a MSM-2DEG varactor and a method of manufacturing the same, which employs a nano-scale T-shaped gate and a micron-scale rectangular gate to form an asymmetric structure or a balanced structure, and raises a cutoff frequency to operate in a terahertz domain.

2. Discussion of Related Art

There have been many advances in an electronic device applied to a high frequency band, and the electronic device has been also developed to be used even in a terahertz (THz) domain.

A THz electronic circuit of operating in the terahertz domain needs a varactor diode, and research on improving non-linear capacitance-voltage characteristics of a varactor and raising a cutoff frequency up to the terahertz domain has been continued.

As an element for capacitance switching in the terahertz domain, a metal-semiconductor-metal two-dimensional electron gas varactor may be used. The metal-semiconductor-metal two-dimensional electron gas varactor has advantages of having a simple structure, enabling steep capacitance switching, being bi-stable, reducing a leakage current, and having compatibility with high electron mobility transistor (HEMT).

However, a conventional MSM-2DEG varactor has a problem of having a relatively low cutoff frequency due to associated series resistance. Therefore, a study for raising the cutoff frequency has been ongoing.

As one of approaches to raise the cutoff frequency of the MSM-2DEG varactor, there have been proposed an AlGaN/GaN-based MSM-2DEG varactor having a cutoff frequency of 74 GHz [non-patent document 1], and an InAlN/GaN-based MSM-2DEG varactor having a cutoff frequency of 0.3 THz [non-patent document 2].

However, such approaches are not effective any more since a smaller gate length decreases a capacitance switching rate and increases resistance. Further, if the gate length is smaller than 100 nm, the cutoff frequency is not enhanced any more due to increasing metal-semiconductor interfacial resistance. Eventually, a new approach is required for raising the cutoff frequency of the MSM-2DEG varactor so that the MSM-2DEG varactor can operate in the terahertz domain of a higher frequency.

PRIOR ART LITERATURES

Non-Patent Document (Non-patent document 1) [Non-patent document 1] M. Marso, A. Fox, G. Heidelberger, P. Kordo, and H. Luth, "Comparison of AlGaN/GaN MSM varactor diodes based on HFET and MOSHFET layer structures", IEEE Electron Device Lett., vol. 27, no. 12, pp. 945-947, December 2006, doi: 10.1109/LED.2006.886705.

(Non-patent document 2) [Non-patent document 2] D.-M. Geum, S. H. Shin, S.-M. Hong, and J.-H. Jang, "Metal-Semiconductor-Metal Varactors Based on InAlN/GaN Heterostructure With Cutoff Frequency of 308 GHz," IEEE Electron Device Lett., vol. 36, no. 4, pp. 306-308, April 2015, doi: 10.1109/LED.2015.2400447.

SUMMARY OF THE INVENTION

The present disclosure is directed to a metal-semiconductor-metal two-dimensional electron gas (MSM-2DEG) varactor, which can operate in a terahertz domain, by reducing associated series resistance, making a high capacitance switching rate, and raising a cutoff frequency of the MSM-2DEG varactor.

According to an aspect of the present disclosure, there is provided an MSM-2DEG varactor including: a first gate which is formed on a semiconductor layer; and a second gate which is spaced apart at a predetermined distance from the first gate and formed on the semiconductor layer, the first gate and the second gate being different in shape and gate length.

The first gate may be a rectangular gate having a micron-scale gate length, and the second gate may be a T-shaped gate having a nano-scale gate length.

The second gate may include an upper end portion having a length which ranges from 300 nm to 1 µm.

The second gate may have a gate length which ranges from 50 nm to 500 nm.

The first gate and the second gate may have a micron-scale gate width.

The first gate may be configured to form an anode, and the second gate may be configured to form a cathode.

The MSM-2DEG varactor may further include a third gate which is formed on the semiconductor layer and symmetrical to the first gate with respect to the second gate.

The third gate may have the same shape and the same gate length as those of the first gate.

The first gate and the third gate may be configured to form anodes, and the second gate may be configured to form a cathode.

According to another aspect of the present disclosure, there is provided a method of manufacturing an MSM-2DEG varactor, the method including: (A) forming a semiconductor layer on a growth substrate; (B) forming a first gate on the formed semiconductor layer; and (C) forming a second gate to be spaced apart from the first gate on the formed semiconductor layer, the first gate and the second gate being different in shape and gate length.

The first gate may be a rectangular gate having a micron-scale gate length, and the second gate may be a T-shaped gate having a nano-scale gate length.

The (B) may include forming a third gate to be spaced apart from the first gate, together with the first gate, on the formed semiconductor layer, the first gate and the third gate may be symmetrical to each other with respect to the second gate, and the third gate may be different in shape and gate length from the second gate. The third gate may have the same shape and the same gate length as those of the first gate.

The (A) may include forming an electron cloud layer by growing a predetermined material and etching opposite end portions of the electron cloud layer as much as a predetermined length by a mesa-etching method.

According to still another aspect of the present disclosure, there is provided a method of manufacturing a MSM-2DEG varactor, the method including: (A) forming a semiconductor layer on a growth substrate; (B) forming a first gate on the formed semiconductor layer; and (C) forming a second gate and a third gate to be spaced apart from the first gate and symmetrical to each other with respect to the first gate on the formed semiconductor layer, the second gate and the third gate being different in shape and gate length from the first gate.

The third gate may have the same shape and the same gate length as those of the second gate.

The first gate may be a T-shaped gate having a nano-scale gate length, and the second gate may be a rectangular gate having a micron-scale gate length.

The method of manufacturing the MSM-2DEG varactor may further include, in between the (B) and the (C), depositing a dielectric on a surface of the semiconductor layer and etching the deposited dielectric to form the second gate and the third gate, wherein the dielectric deposited at lower opposite sides of the first gate may not be etched in the etching of the deposited dielectric.

The (C) may include forming the second gate and the third gate by a self-alignment process.

The (A) may include forming an electron cloud layer by growing a predetermined material and etching opposite end portions of the electron cloud layer as much as a predetermined length by a mesa-etching method.

BRIEF DESCRIPTION OF THE DRAWINGS

The above and other objects, features and advantages of the present disclosure will become more apparent to those of ordinary skill in the art by describing exemplary embodiments thereof in detail with reference to the accompanying drawings, in which.

DETAILED DESCRIPTION OF EXEMPLARY EMBODIMENTS

In this specification, terms "first" and/or "second," etc. are only used to distinguish one element from another. In other words, the elements are not limited by these terms.

In this specification, terms "include" used for the elements, features and operations specify the presence of the elements, features and operations, and do not preclude the presence of one or more other elements, features, operations and their equivalents.

In this specification, the singular forms are intended to include the plural forms as well, unless the context clearly indicates otherwise. That is, the elements or the like stated in this specification may mean the presence or addition of one or more other elements.

Unless otherwise defined, all terms (including technical and scientific terms) used herein have the same meaning as commonly understood by a person having an ordinary skill in the art—those skilled in the art—to which the present disclosure belongs.

It will be further understood that terms, such as those defined in commonly used dictionaries, should be interpreted as having a meaning that is consistent with their meaning in the context of the relevant art and will not be interpreted in an idealized or overly formal sense unless expressly so defined here.

Below, embodiments of the present disclosure will be described in detail with reference to FIGS. 1, 2, 3, 4, 5, 6, 7, 8, 9, 10, and 11. However, it will be understood by those skilled in the art that the descriptions given in this specification with reference to the accompanying drawings are for illustrative purposes only since the present disclosure extends beyond these limited embodiments.

First, limitations in the related art will be described.

A conventional MSM-2DEG varactor includes a semiconductor layer, and two gates each having a nano-scale gate length. In this case, the gate may have one of a T shape or a rectangular shape. That is, the conventional MSM-2DEG varactor has a symmetric structure. In this case, the related art employs a method of decreasing the gate length in order to increase a cutoff frequency. According to this approach, a capacitance switching rate is lowered when the gate length is shorter than a predetermined length (100 nm), and it is thus difficult to raise the cutoff frequency in a terahertz domain up to a certain value or higher due to increase in metal-semiconductor interfacial resistance.

Next, with reference to FIGS. 1, 2, and 3, the MSM-2DEG varactor according to one embodiment of the present disclosure will be described.

Figure 1:
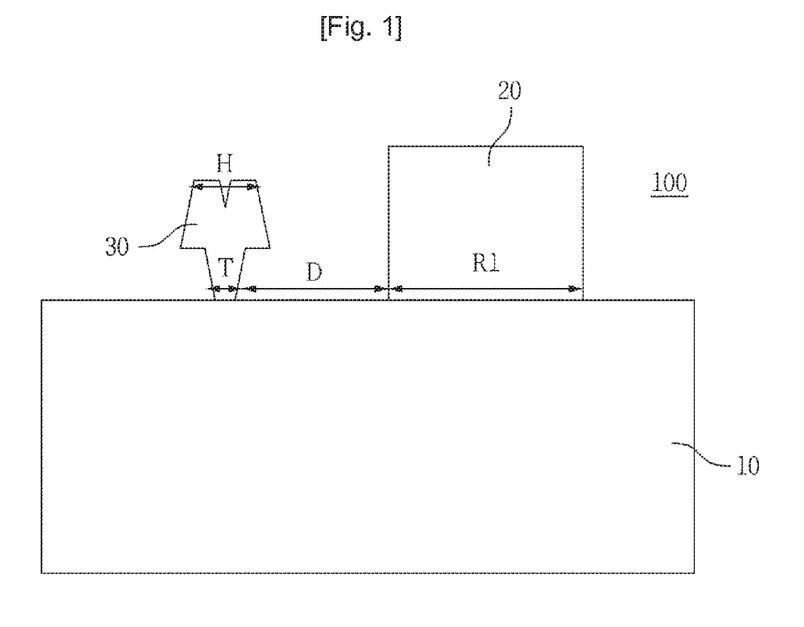
FIG. 1 is a diagram of showing a metal-semiconductor-metal two-dimensional electron gas (MSM-2DEG) varactor according to one embodiment of the present disclosure.

FIG. 1 is a diagram of showing an MSM-2DEG varactor according to one embodiment of the present disclosure.

Referring to FIG. 1, the MSM-2DEG varactor according to this embodiment of the present disclosure may include a semiconductor layer 10, a first gate 20, and a second gate 30. The first gate 20 and the second gate 30 may be formed on the semiconductor layer 10. The first gate 20 and the second gate 30 may be different in shape. There may be a difference between a gate length R1 of the first gate 20 and a gate length T of the second gate 30. According to this embodiment, the MSM-2DEG varactor may have an asymmetric structure.

The first gate 20 may form an anode, and the second gate 30 may form a cathode. To minimize the gate resistance of the anode, the first gate 20 may have a rectangular shape and may have a micron-scale gate length R1. To minimize the gate resistance of the cathode, the second gate 30 may have a T shape and may have a nano-scale gate length T.

The semiconductor layer 10 may include a substrate, a nucleation layer, a buffer layer, a barrier layer, and a cap layer. The semiconductor layer 10 may have a heterostructure. The semiconductor layer 10 may include a material having a two-dimensional electron cloud layer. The semiconductor layer 10 may include GaN, GaAs, InP, etc. Preferably, the buffer layer may include GaN, and the barrier layer may be a Schottky barrier layer having a thickness of 22 nm and including $Al_{0.24}Ga_{0.76}N$. Preferably, the cap layer may have a thickness of 3 nm and include GaN.

Figure 2:
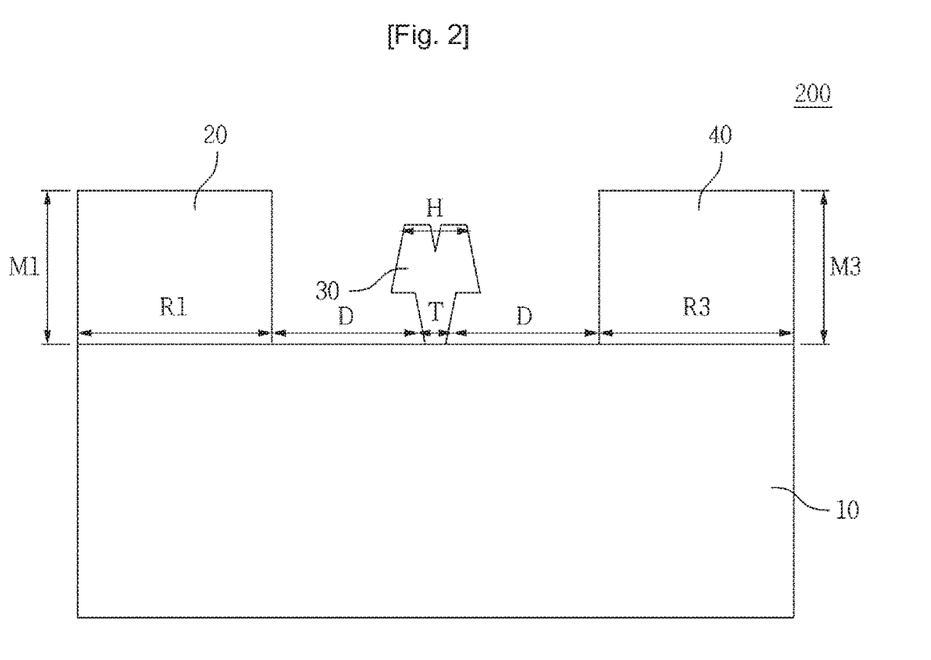
FIG. 2 is a cross-sectional view of showing the MSM-2DEG varactor according to one embodiment of the present disclosure.
Figure 3:
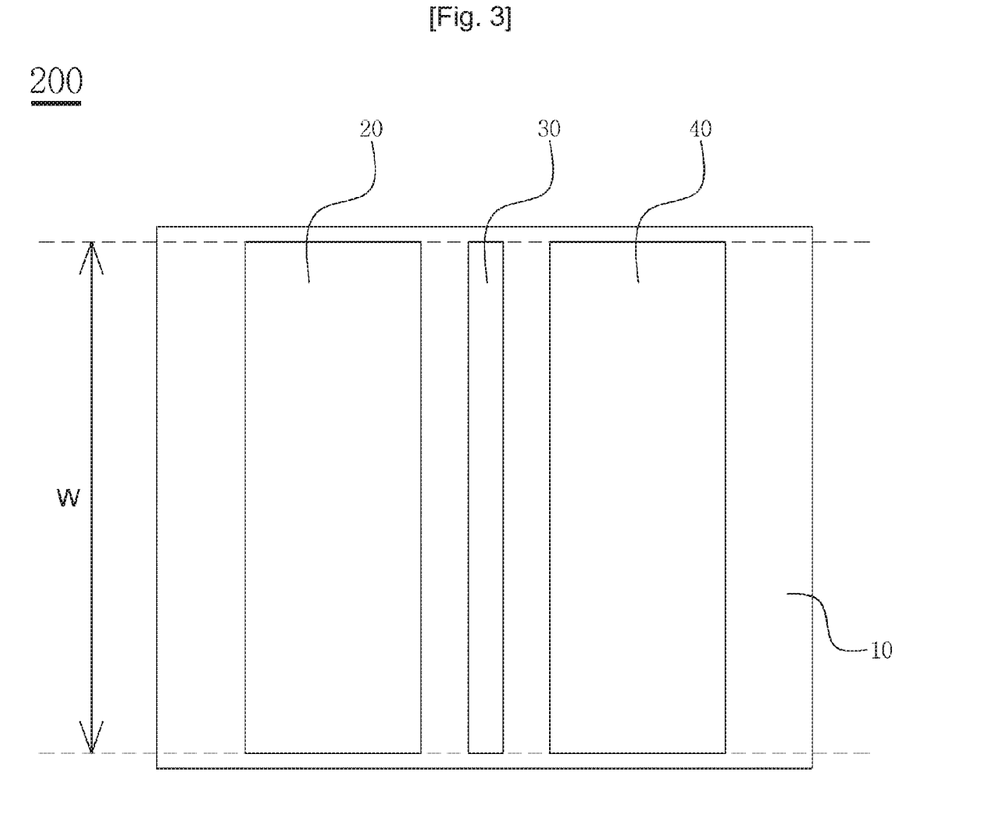
FIG. 3 is a plan view of showing the MSM-2DEG varactor according to one embodiment of the present disclosure.

FIG. 2 is a cross-sectional view of showing an MSM-2DEG varactor according to still another embodiment of the present disclosure, and FIG. 3 is a plan view of showing the MSM-2DEG varactor according to still another embodiment of the present disclosure.

Referring to FIG. 2 and FIG. 3, the MSM-2DEG varactor according to one embodiment of the present disclosure may include the semiconductor layer 10, the first gate 20, the second gate 30, and a third gate 40. The first gate 20, the second gate 30 and the third gate 40 may be formed on the semiconductor layer 10. The first gate 20 and the second gate 30 may be different in shape. There may be a difference between the gate length R1 of the first gate 20 and the gate length T of the second gate 30.

The third gate 40 may be formed on the semiconductor layer 10 and symmetrical to the first gate 20 with respect to the second gate 30. The third gate 40 may have the same shape as that of the first gate 20. A gate length R3 of the third gate 40 may be equal to the gate length R1 of the first gate 20. The MSM-2DEG varactor according to one embodiment of the present disclosure may have a balanced structure.

The first gate 20 and the third gate 40 may form the anodes, and the second gate 30 may form the cathode. To minimize the gate resistance of the anode, the first gate 20 may have a rectangular shape and may have a micron-scale gate length R1. To minimize the gate resistance of the cathode, the second gate 30 may have a T shape and may have a nano-scale gate length T.

It is preferable that a spacing distance D be made as short as possible as long as DC open state is maintained. Preferably, a length H of an upper end portion of the second gate 30 may range from 300 nm to 1 μm. Preferably, the gate length T of the second gate 30 may range from 50 nm to 500 nm. Preferably, a gate height M1 of the first gate 20 and a gate height M3 of the third gate 40 may be equal to or greater than 300 nm. A gate width W may preferably have a micron-scale value, and may more preferably range from 15 μm to 150 μm to enhance the cutoff frequency.

Next, the effects of the MSM-2DEG varactor according to one embodiment of the present disclosure will be described with reference to FIGS. 4, 5, and 6.

Figure 4:
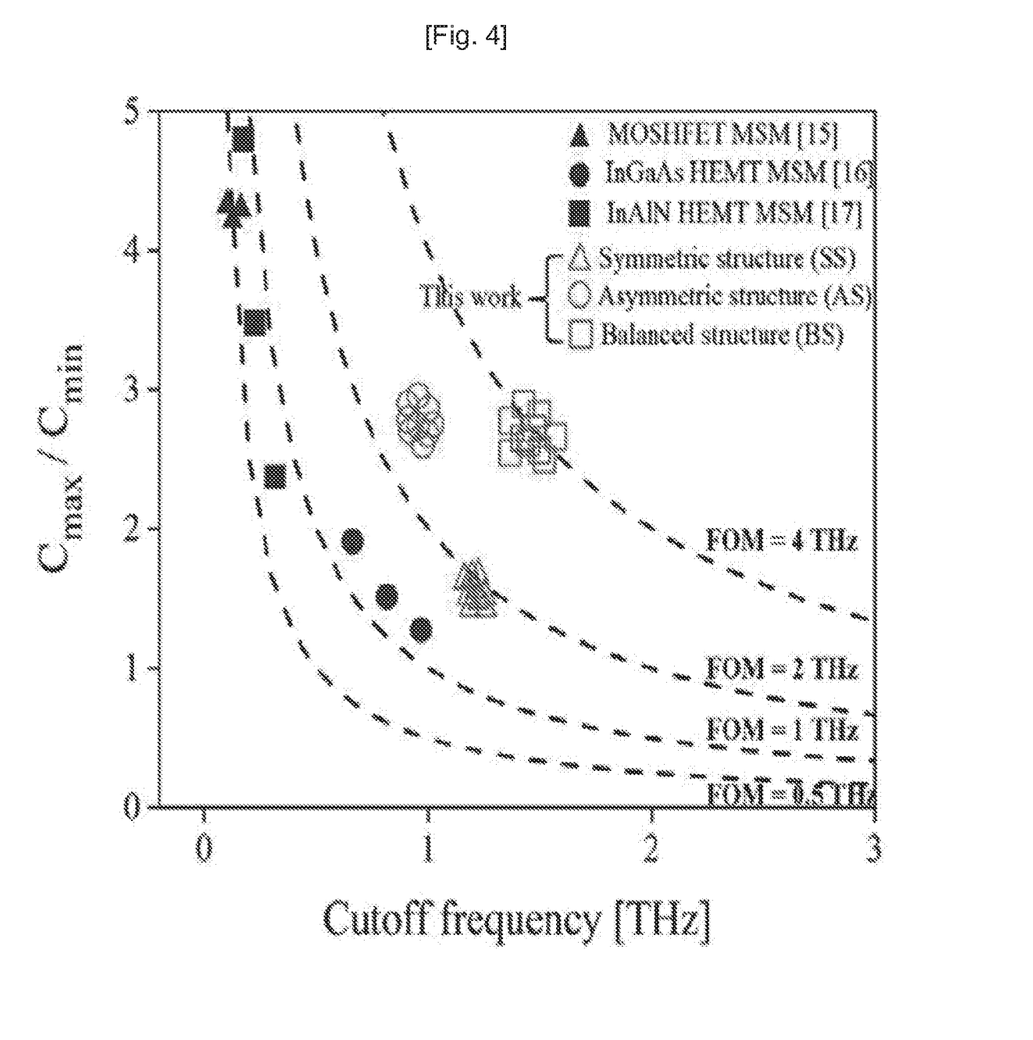
FIG. 4 is a graph of showing a capacitance switching rate versus a cutoff frequency in the MSM-2DEG varactor according to one embodiment of the present disclosure as compared with the related art.
Figure 5:
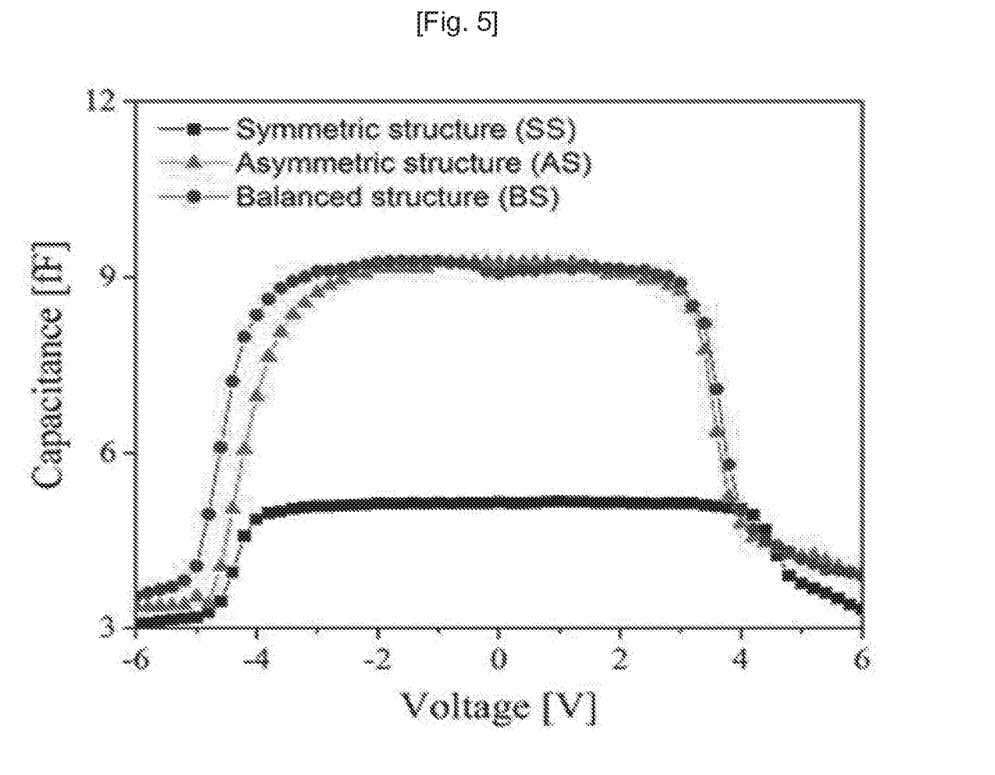
FIG. 5 is a graph of showing capacitance versus voltage in the MSM-2DEG varactor according to one embodiment of the present disclosure as compared with the related art.
Figure 6:
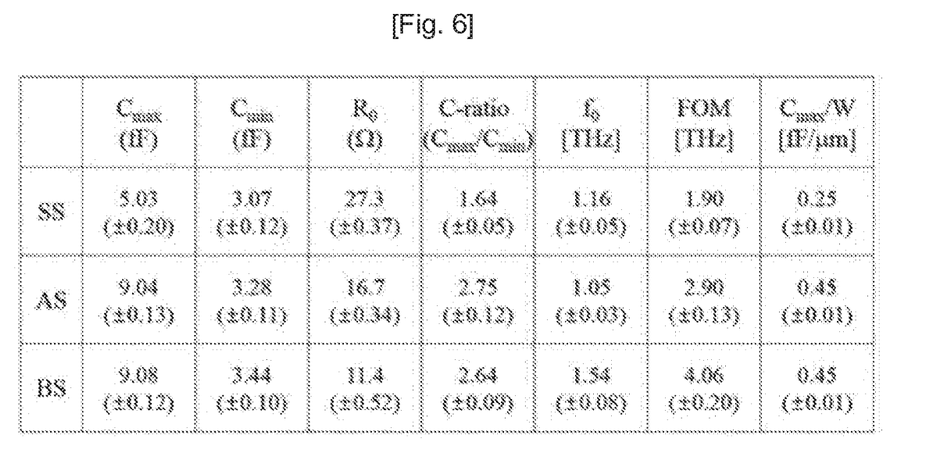
FIG. 6 is a table of showing electric characteristics in the MSM-2DEG varactor according to one embodiment of the present disclosure as compared with the related art.

FIG. 4 is a graph of showing a capacitance switching rate versus a cutoff frequency in the MSM-2DEG varactor according to one embodiment of the present disclosure as compared with the related art, FIG. 5 is a graph of showing capacitance versus voltage in the MSM-2DEG varactor according to one embodiment of the present disclosure as compared with the related art, and FIG. 6 is a table of showing electric characteristics in the MSM-2DEG varactor according to one embodiment of the present disclosure as compared with the related art.

Referring to FIG. 5, the MSM-2DEG varactor having the asymmetric structure or the balanced structure according to one embodiment of the present disclosure has higher capacitance at a zero bias voltage than the conventional MSM-2DEG varactor having the symmetric structure.

In the conventional MSM-2DEG varactor having the symmetric structure, the maximum capacitance at the zero bias voltage is determined based on two Schottky capacitances associated with series-connected two gates.

On the other hand, in the MSM-2DEG varactor having the asymmetric structure or the balanced structure, the maximum capacitance at the zero bias voltage is determined by one second gate 30, the Schottky capacitance of the second gate 30 is much smaller than the Schottky capacitance of the first gate 20.

Referring to FIG. 4 and FIG. 6, the cutoff frequency is defined as $$f_0 = \frac{1}{2\pi R_0 C_0}.$$

Further, Figure Of Merit (FOM) is defined as $$f_0 \times \frac{c_{max}}{c_{min}}.$$

This value refers to the cutoff frequency when the capacitance switching rate is 1, and means the maximum value of the cutoff frequency to be effectively raised by a certain technique for raising the cutoff frequency of the MSM-2DEG varactor.

In the conventional MSM-2DEG varactor having the symmetrical structure, FOM has a value of 1.90±0.07 [THz].

On the other hand, the MSM-2DEG varactor having the asymmetric structure or the balanced structure according to one embodiment of the present disclosure have the FOM values of 2.90±0.13 [THz] and 4.06±0.20 [THz], respectively. That is, according to the present disclosure, there are advantages of providing the MSM-2DEG varactor, which has a higher cutoff frequency in a terahertz domain than the conventional one while having a significant capacitance switching rate.

Next, referring to FIGS. 7, 8, 9, 10, and 11, a method of manufacturing the MSM-2DEG varactor according to one embodiment of the present disclosure will be described.

Figure 7:
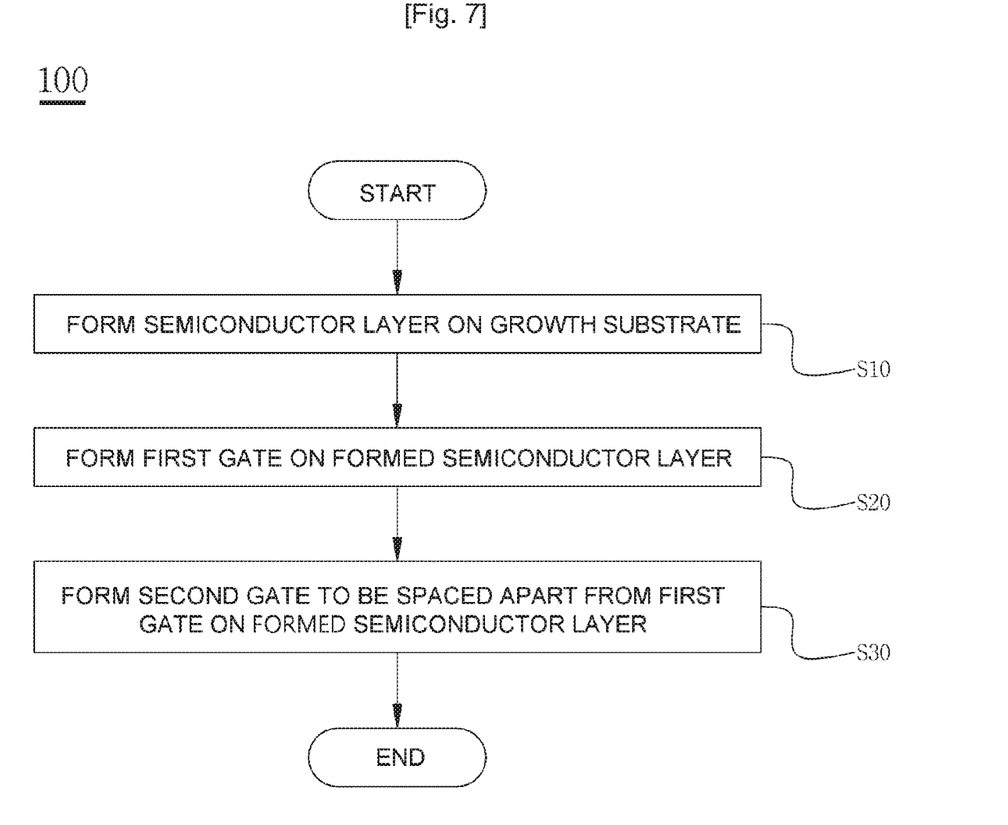
FIG. 7 is a flowchart of showing a method of manufacturing the MSM-2DEG varactor according to one embodiment of the present disclosure.

FIG. 7 is a flowchart of showing a method of manufacturing the MSM-2DEG varactor according to one embodiment of the present disclosure.

Referring to FIG. 7, the method of manufacturing the MSM-2DEG varactor according to this embodiment includes operations of forming the semiconductor layer 10 on a growth substrate 50 (S10), forming the first gate 20 on the formed semiconductor layer 10 (S20), and forming the second gate 30 to be spaced apart from the first gate 20 on the semiconductor layer 10 (S30).

By the manufacturing method according to the present embodiment, the MSM-2DEG varactor may have the asymmetric structure.

Figure 8:
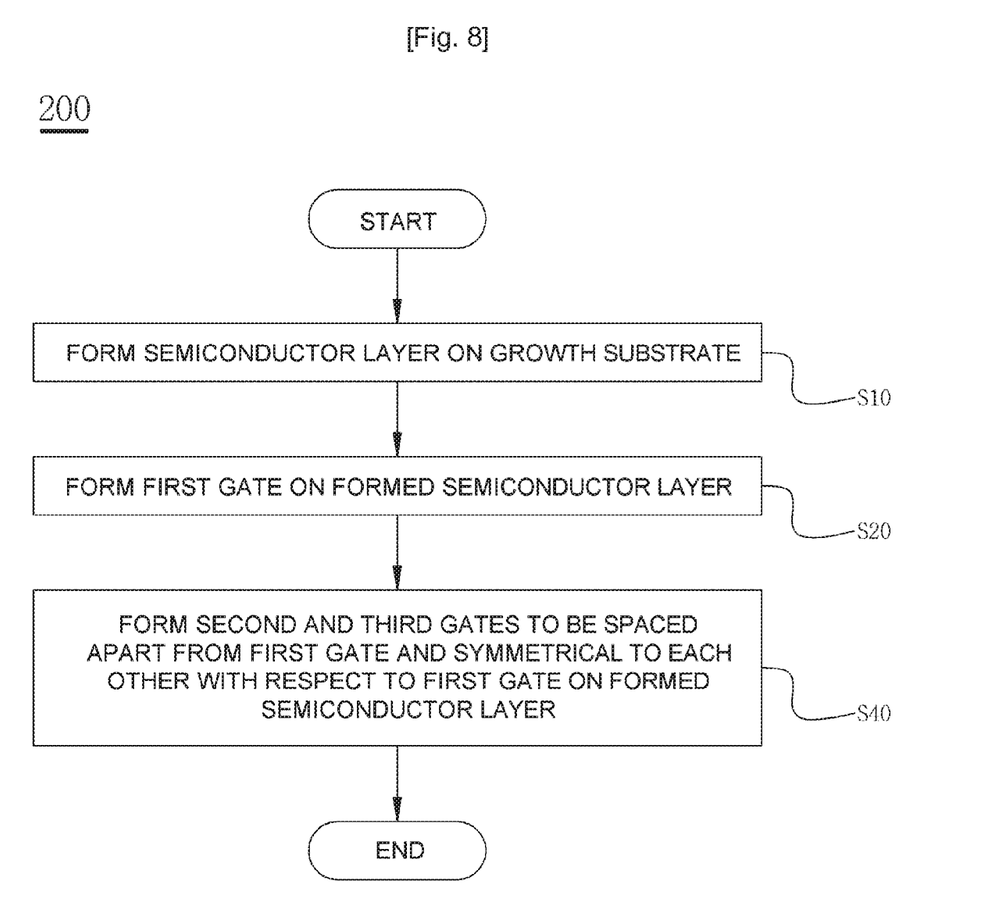
FIG. 8 is a flowchart of showing a method of manufacturing the MSM-2DEG varactor according to one embodiment of the present disclosure.
Figure 9:
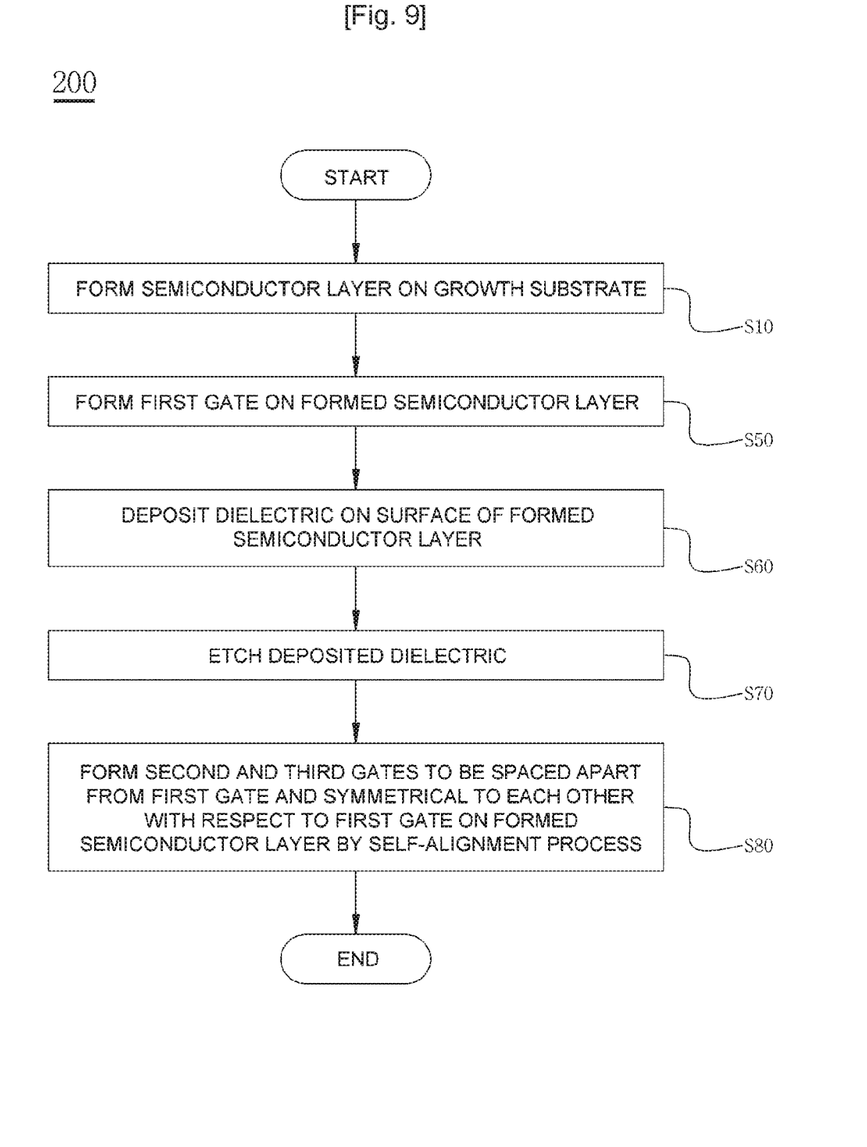
FIG. 9 is a flowchart of showing a method of manufacturing the MSM-2DEG varactor according to one embodiment of the present disclosure.
Figure 10:
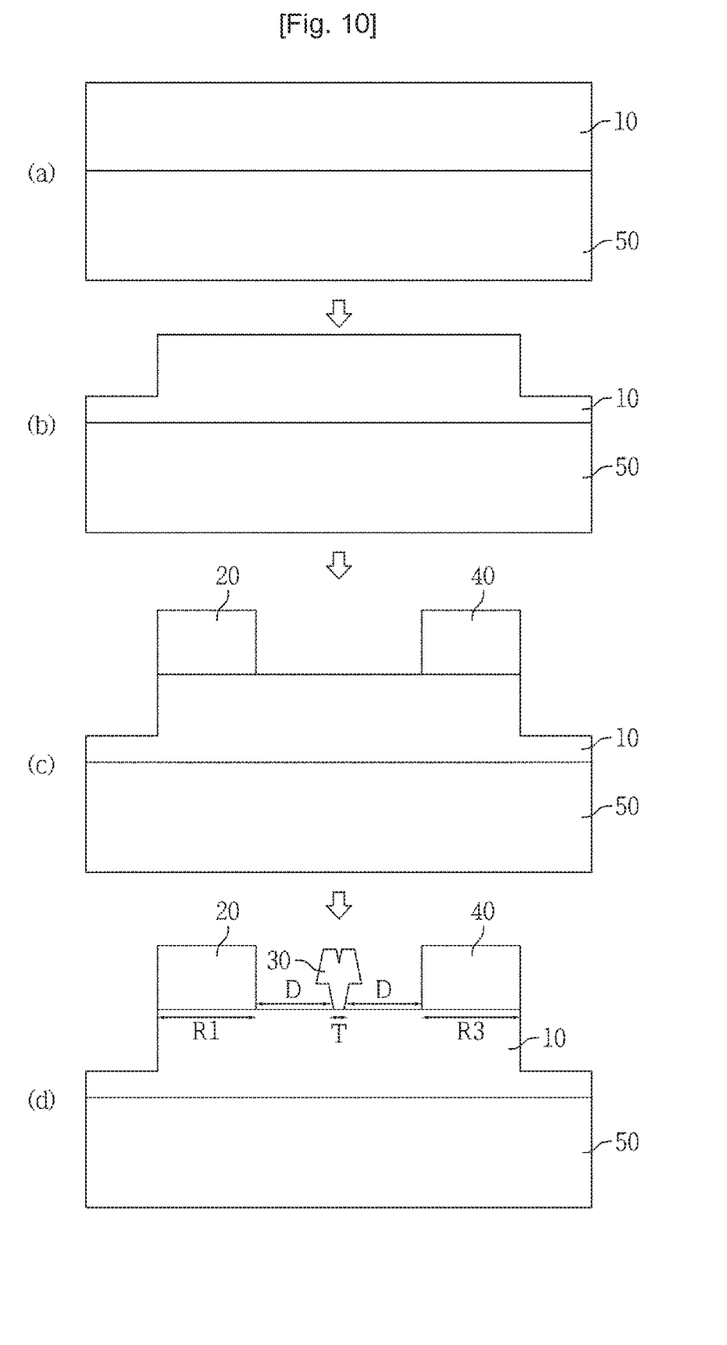
FIG. 10 is a schematic diagram corresponding to the flowchart of FIG. 9.

FIG. 8 is a flowchart of showing a method of manufacturing the MSM-2DEG varactor according to another embodiment of the present disclosure, and FIG. 10 is a schematic diagram corresponding to the flowchart of FIG. 9.

Referring to FIG. 8 and FIG. 10, the method of manufacturing the MSM-2DEG varactor according to this embodiment includes operations of forming the semiconductor layer 10 on the growth substrate 50 (S10), forming the first gate 20 and the third gate 40 as the first and second gates on the formed semiconductor layer 10 (S20), and forming the second gate 30 as the third gate to be spaced apart from the first gate 20 and the third gate 40 on the formed semiconductor layer 10 (S40). In this case, the first gate 20 and the third gate 40 may be symmetrical to each other with respect to the second gate 30.

By the manufacturing method according to the present embodiment, the MSM-2DEG varactor may have the balanced structure.

Figure 11:
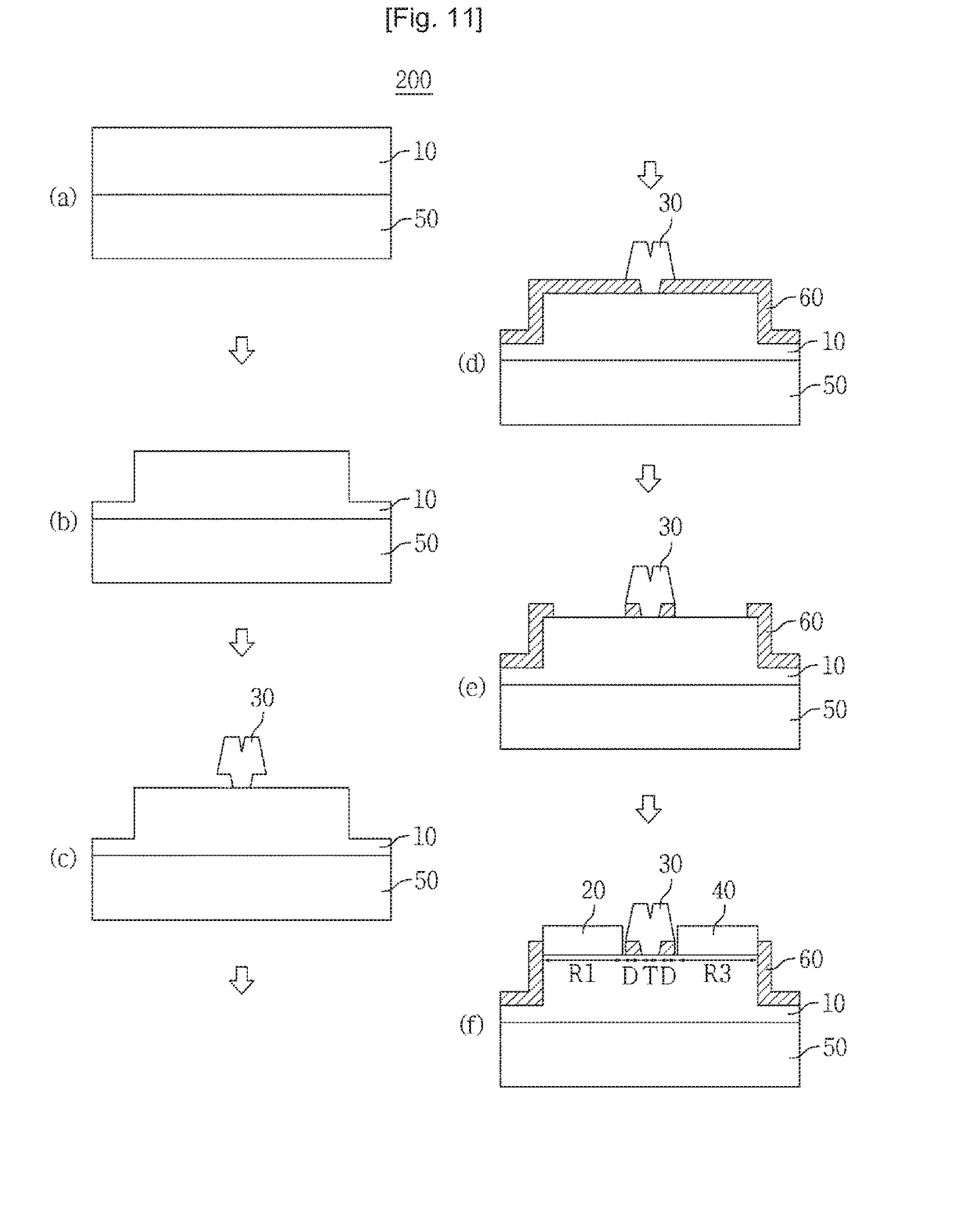
FIG. 11 is a schematic diagram corresponding to the flowchart of FIG. 10.

FIG. 9 is a flowchart of showing a method of manufacturing the MSM-2DEG varactor according to still another embodiment of the present disclosure, and FIG. 11 is a schematic diagram corresponding to the flowchart of FIG. 10.

Referring to FIG. 9 and FIG. 11, the method of manufacturing the MSM-2DEG varactor according to this embodiment includes operations of forming the semiconductor layer 10 on the growth substrate 50 (S10), forming the second gate 30 as the first gate on the formed semiconductor layer 10 (S50), depositing a dielectric 60 on a surface of the semiconductor layer 10 (S60), etching the deposited dielectric 60 in order to prepare a place where the first gate 20 and the third gate 40 will be formed (S70), and forming the first gate 20 and the third gate 40 as the second and third gates to be spaced part from the second gate 30 and symmetrical to each other with respect to the second gate 30 by a predetermined process on the semiconductor layer 10 (S80). In this case, the predetermined process may be a self-alignment process.

If the first gate 20 and the third gate 40 are formed by the self-alignment process, the spacing distance D may be further reduced as long as the DC open is maintained, thereby improving the performance of the manufactured MSM-2DEG varactor.

The method of etching the deposited dielectric 60 may be achieved by dry etching.

The first gate 20 and the third gate 40 may be different in shape from the second gate 30.

Further, the MSM-2DEG varactor manufactured by the method according to this embodiment may have the balanced structure.

The second gate 30 may be a gate having a T shape. In this case, the second gate 30 may be formed before the first gate 20 and the third gate 40 in order to use the self-alignment process.

Further, in this case, the dielectrics deposited at the lower opposite sides of the T-shaped gate may not be etched while the deposited dielectric 60 is etched.

In the manufacturing methods according to the foregoing embodiments, the operation S10 of forming the semiconductor layer 10 on the growth substrate 50 may include forming an electron cloud layer by growing a predetermined material on the growth substrate 50, and etching the opposite ends of the electron cloud layer as much as a predetermined length by a mesa-etching method. The predetermined material may be a material having a two-dimensional electron cloud layer.

The predetermined length may be a length suitable for forming the first gate 20 and the second gate 30 on a surface of the non-etched electron cloud layer. Alternatively, the predetermined length may be a length suitable for forming the first gate 20, the second gate 30, and the third gate 40 on the surface of the non-etched electron cloud layer.

In the MSM-2DEG varactor according to one embodiment of the present disclosure, the T-shaped gate having a nano-scale gate length and the rectangular gate having a micron-scale gate length are used to form the MSM-2DEG varactor, and therefore the cutoff frequency thereof can be raised higher than that of the related art, thereby having effects of performing the capacitor switching by using the MSM-2DEG varactor in a higher terahertz frequency domain.

Further, in the method of manufacturing the MSM-2DEG varactor according to another embodiment of the present disclosure, the spacing distance between the gates becomes narrower by the self-alignment process, thereby having effects of manufacturing the MSM-2DEG varactor having a higher cutoff frequency.

Although some exemplary embodiments of the present disclosure are described, changes, substitutes and equivalents can be made without departing from the scope of the present disclosure.

Further, it will be appreciated that there are many alternatives to the embodiments of the MSM-2DEG varactor according to the present disclosure. Accordingly, the appended claims should be construed as involving all the changes, substitutes and equivalents which belong to the spirit and scope of the present disclosure.

What is claimed is:

1. A metal-semiconductor-metal two-dimensional electron gas (MSM-2DEG) varactor comprising:
    a first gate formed on a semiconductor layer;
    a second gate formed on the semiconductor layer and spaced apart at a predetermined distance from the first gate, the first gate and the second gate being different in shape and gate length;
    a third gate formed on the semiconductor layer and spaced apart at the predetermined distance from the second gate, wherein the first gate and the third gate are symmetrical to each other with respect to the second gate; and
    a dielectric formed on the semiconductor layer and disposed between the second gate and the semiconductor layer at the lower left and lower right sides of the second gate;
    wherein a first space having the predetermined distance between the first and second gate is free from the dielectric and a second space having the predetermined distance between the second gate and the third gate is free from the dielectric.

2. The MSM-2DEG varactor according to claim 1, wherein
    the first gate comprises a rectangular gate having a micron-scale gate length, and
    the second gate comprises a T-shaped gate having a nano-scale gate length.

3. The MSM-2DEG varactor according to claim 2, wherein the second gate comprises an upper end portion having a length which ranges from 300 nm to 1 µm.

4. The MSM-2DEG varactor according to claim 2, wherein the second gate has a gate length which ranges from 50 nm to 500 nm.

5. The MSM-2DEG varactor according to claim 2, wherein the first gate and the second gate have a micron-scale gate width.

6. The MSM-2DEG varactor according to claim 1, wherein
   the first gate is configured to form an anode, and
   the second gate is configured to form a cathode.

7. The MSM-2DEG varactor according to claim 1, wherein the third gate has the same shape and the same gate length as those of the first gate.

8. The MSM-2DEG varactor according to claim 1, wherein the first gate and the third gate are configured to form anodes, and the second gate is configured to form a cathode.

* * * * *